`US005620827A`

United States Patent [19]

Cheng et al.

[11] Patent Number: 5,620,827
[45] Date of Patent: Apr. 15, 1997

[54] ON-PRESS DEVELOPABLE LITHOGRAPHIC PRINTING PLATE PRECURSOR

[75] Inventors: Chieh-Min Cheng, Arlington; Anthony C. Giudice, Wakefield; John M. Hardin, Jamaica Plain; Rong-Chang Liang, Lexington; Leonard C. Wan, Chestnut Hill, all of Mass.

[73] Assignee: Polaroid Corporation, Cambridge, Mass.

[21] Appl. No.: 469,475

[22] Filed: Jun. 6, 1995

Related U.S. Application Data

[62] Division of Ser. No. 146,710, Nov. 1, 1993, Pat. No. 5,516,620.

[51] Int. Cl.$^6$ ........................................... G03C 1/72
[52] U.S. Cl. .................... 430/138; 430/302; 430/273.1
[58] Field of Search .................................. 430/138, 302, 430/273

[56] References Cited

U.S. PATENT DOCUMENTS

| | | | |
|---|---|---|---|
| 3,867,150 | 2/1975 | Ketley | 96/36.3 |
| 4,284,696 | 8/1981 | Ishida et al. | 430/42 |
| 4,399,209 | 8/1983 | Sanders et al. | 430/138 |
| 4,440,846 | 4/1984 | Sanders et al. | 430/138 |
| 4,562,137 | 12/1985 | Sanders | 430/138 |
| 4,636,453 | 1/1987 | Keys et al | 430/138 |
| 4,687,725 | 8/1987 | Wright et al. | 430/138 |
| 4,782,002 | 11/1988 | Makino et al. | 430/138 |
| 4,879,201 | 11/1989 | Hasegawa | 430/138 |
| 4,884,501 | 12/1989 | Izaki et al. | 100/176 |
| 4,904,563 | 2/1990 | Aoai et al. | 430/138 |
| 4,910,118 | 3/1990 | Adair et al. | 430/138 |
| 4,916,041 | 4/1990 | Hasegawa et al. | 430/138 |
| 4,937,159 | 6/1990 | Gottschalk | 430/138 |
| 4,962,009 | 10/1990 | Washizu et al. | 430/138 |
| 4,999,273 | 3/1991 | Hasegawa | 430/138 |
| 5,045,430 | 9/1971 | Shackle et al. | 430/138 |
| 5,230,982 | 7/1993 | Davis et al. | 430/138 |
| 5,368,973 | 11/1994 | Hasegawa | 430/138 |
| 5,506,090 | 4/1996 | Gardner, Jr. et al. | 430/302 |

FOREIGN PATENT DOCUMENTS

| | | |
|---|---|---|
| A20237054 | 9/1987 | European Pat. Off. . |
| A20275044 | 7/1988 | European Pat. Off. . |
| 2202964 | 10/1988 | United Kingdom . |

*Primary Examiner*—George F. Lesmes
*Assistant Examiner*—Laura Weiner
*Attorney, Agent, or Firm*—Renato M. de Luna

[57] ABSTRACT

A lithographic printing plate precursor for use on a printing press, with minimal or no additional processing after exposure to actinic radiation, comprises a printing plate substrate, a polymeric resist layer capable of imagewise photodegradation or photohardening, and a plurality of microencapsulated developers capable of blanket-wise promoting the washing out of either exposed or unexposed areas of the polymeric resist. The microencapsulated developers may be integrated into the polymeric resist layer, or may form a separate layer deposited atop the polymeric resist layer, or may be coated onto a separate sheet support capable of being brought into face-to-face contact with conventional printing plates.

8 Claims, 3 Drawing Sheets

ON-PRESS DEVELOPABLE LITHOGRAPHIC PRINTING PLATE PRECURSOR

This application is a division of application Ser. No. 08/146,710, filed Nov. 1, 1993, now U.S. Pat. No. 5,516,620.

CROSS-REFERENCE TO RELATED APPLICATIONS

U.S. patent applications Ser. Nos. 08/147,045 and 08/146,711 now abandoned, concurrently filed by W. C. Schwarzel, F. R. Kearney, M. J. Fitzgerald and R. C. Liang, commonly assigned, and titled "Lithographic Printing Plates with Photoreactive Poymeric Binders" and "Synthesis of Photoreactive Polymeric Binders", respectively, describe a photoreactive polymeric binder that may be used to enhance photospeed in either conventional plates or on-press developable lithographic printing plates. Briefly, a polymer of m-isopropenyl-α,α-dimethylbenzyl isocyanate is derivatized for vinyl group reactivity by reacting the isocyanate groups thereof with a hydroxyalkyl acrylate, such as 4-hydroxybutyl acrylate. The resulting photopolymeric binder provides higher photospeed than compositions containing non-reactive binders typically utilized in the production of printing plates. Lithographic printing plates utilizing the photoreactive polymeric binder have good durability (as manifested by good run-length) and can be developed using relatively weak developers. As to the preparation of the photoreactive binders, the applications describe a method of copolymerizing m-isopropenyl-α,α-dimethylbenzyl isocyanate through complexation with an electron-deficient monomer such as maleic anhydride to accelerate free radical copolymerization with other monomers. The maleic anhydride accelerated process is kinetically more efficient and provides greater monomer-to-polymer conversion. Use of the resulting product in the photoresist of a lithographic printing plate improves its adhesion.

U.S. patent application Ser. No. 08/147,044 now abandoned, concurrently filed by F. R. Kearney, J. M. Hardin, M. J. Fitzgerald, and R. C. Liang, commonly assigned, and titled "Lithographic Printing Plates with Plasticized Photoresists", discloses the use of plasticizers, surfactants and lithium salts as development aids for negative-working, on-press developable lithographic printing plates. Briefly, plasticizers, which are dispersible or soluble in press fountain solutions and soluble in acrylic monomers and oligomers, are incorporated into a photoresist. Such plasticizers make the photoresist more permeable to fountain solution prior to crosslinking, while being easily extracted with ink and fountain solution after crosslinking. The surfactants facilitate the dispersion of hydrophobic imaging compositions in the fountain solution and reduce scumming. Further, lithium salts may also be incorporated into the photoresist to disrupt hydrogen bonding of, for example, urethane acrylate polymers which tend to associate by hydrogen bonding, thus enhancing developability.

U.S. patent application Ser. No. 08/146,479, now abandoned concurrently filed by L. C. Wan, A. C. Giudice, W. C. Schwarzel, C. M. Cheng, and R. C. Liang, commonly assigned, and titled "Lithographic Printing Plates with Dispersed Rubber Additives", describes the use of rubbers and surfactants to enhance the durability of on-press developable printing plates. The rubbers are preferably incorporated into a photoresist as discrete rubber particles. To ensure a uniform and stable dispersion, the rubber components are suspended in the photoresist preferably by means of surfactants having HLBs approximately between 7.0 and 18.0.

The disclosures of the aforementioned copending applications are hereby incorporated by reference.

BACKGROUND OF THE INVENTION

1. Field of the Invention

In general, the present invention relates to on-press developable lithographic printing plate precursors (sometimes hereinafter, on-press developable lithographic printing plates) and, more particularly, to on-press lithographic printing plates with microencapsulated developers which allow the plates to be run on a printing press after exposure to actinic radiation without intermediate wet processing steps.

2. Description of the Prior Art

The production of conventional lithographic printing plates, particularly those based upon an aluminum sheet-like support, is well known in the lithographic arts. Such printing plates are typically of the planographic types and printing is accomplished from a substantially flat surface where printing areas are neither raised appreciably above nor depressed appreciably below adjacent and surrounding non-printing areas. In general, these plates comprise hydrophobic (water-repelling) ink-receptive image areas and hydrophilic (ink-repelling) water receptive non-image areas. The hydrophilic non-image areas are typically hydrophilic surfaces bared by a wet (or bath) development process. Thus, non-image areas of photoresist material can, for example, be washed or otherwise removed, to bare a hydrophilic resinous layer, an aluminum (or other metal plate) surface, an anodized aluminum (or other metal plate) surface or a metal plate having a phosphate- or silicate-treated hydrophilic surface.

In the processing of a conventional printing plate prior to use on a printing press, a wet development step will normally be conducted after a photo-exposure step, to remove non-exposed or exposed regions, depending, for example, whether a negative-working or positive-working photoresist, respectively, is used over the hydrophilic surface. More specifically, the goal of most commercial developing systems for lithographic printing plates is to provide preferential solvation of an organic coating (or resist) which has undergone a photoinduced chemical change. The photoinduced chemical reaction may either reduce or enhance the solubility of the coating, depending on whether the resist is negative-working or positive-working, respectively. In the case of negative-working resists, the solvent must swell and dissolve the unexposed portions of the resist well, but must not swell the exposed portions or distortion of the developed image may result. In the case of positive-working resists, the responses of the unexposed and exposed portions are reversed, but the same principles of preferential solvation apply. The wet development process will usually involve washing and rinsing operations which may be assisted by rubbing or brushing. Other operations such as plate "gumming" may also be performed.

Encumbered by required wet development, the processing of conventional lithographic plates prior to their use on the printing press is time and labor consuming and involves the use of substantial quantities of organic chemicals. It will be appreciated that there is considerable attractiveness for innovations that would satisfactorily eliminate or reduce conventional lithography's long-felt dependency upon the conduct of wet development and thereby permit the use of lithographic plates on a printing press immediately after exposure without required intermediary processing.

Dry lithographic printing plates have been known. These enable the wet processing steps of conventional lithographic printing plates after exposure to be omitted. For example, U.S. Pat. No. 3,793,033, issued to Mukherjee on Feb. 19, 1974, suggests a presensitized, light-sensitive article capable of providing a lithographic printing plate requiring only imagewise exposure to actinic light and no subsequent image development. Mukherjee's plate consists of a support coated with a hydrophilic composition consisting of an organic solvent-soluble phenolic resin and a hydroxyethylcellulose ether, and in reactive association therewith a photoinitiator capable of generating free radicals on exposure to actinic light. Upon imagewise exposure, Mukherjee's coating composition becomes more oleophilic in exposed image areas, while remaining hydrophilic and water-receptive in unexposed areas. U.S. Pat. No. 4,115,127, issued to Ikeda et al. on Sep. 19, 1978, suggests a processing-free lithographic printing plate, which comprises a support having deposited thereon a composition containing germanium and sulfur and at least one of a metal or metal compound in a physically mixed state. As with Mukherjee, exposure to actinic radiation causes relative changes in surface hydrophilicity and oleophilicity.

In contrast to Mukherjee and Ikeda, printing plates based on photosensitive microcapsules have been the subject of prior patents: e.g. U.S. Pat. No. 4,879,201, issued to Hasegawa on Nov. 7, 1989; U.S. Pat. No. 4,916,041, issued to Hasegawa et al. on Apr. 10, 1990; and U.S. Pat. No. 4,999,273, issued to Hasegawa on Mar. 12, 1991. In all cases, oleophilic photopolymerizable compositions were microencapsulated, coated on anodized aluminum substrates, and image-wise exposed through a mask to polymerize and harden the exposed capsules. The photopolymerizable compositions in the non-exposed capsules were then released by either heat or pressure to the hydrophilic aluminum surface and subsequently hardened by a non-imagewise post exposure. A positive image was developed after the imagewise hardened capsules were rubbed off easily by a wet sponge or by the dampening rolls of a lithographic printing press.

While printing plates based on photosensitive microcapsules are dry developable, they are believed to suffer from numerous drawbacks, especially with regard to their durability and resolution. These drawbacks are believed to be accountable to (1) the spreading of the monomer on the high energy aluminum surface, (2) the inhibition of oxygen in the post-exposure step, (3) the high shrinkage and brittleness of the image due to the high monomer concentration in the capsule, and (4) the poor wet adhesion due to the high concentration of water soluble polymers as binders for the capsule coating.

SUMMARY OF THE INVENTION

In view of the shortcomings of conventional technology, it is a primary, albeit non-exclusive, objective of the present invention to provide a lithographic printing plate which may be successfully and effectively utilized by imagewise exposing the lithographic printing plate to actinic radiation and then placing the exposed plate, without required washing or other wet processing, onto a printing press adapted for contact of said lithographic printing plate by at least an oleophilic printing ink and an aqueous fountain solution; and operating the printing press.

In this light, there is provided by the present invention a press-developable printing plate, obtained by overcoating or otherwise integrating a plurality of non-photopolymerizable, developer-containing microcapsules and a photosensitive imaging layer. The imaging layer may be either positive-working or negative-working based on the constituency of the contained developers. The microcapsules comprise at least a core material that is a good developer for the image layer and an impermeable wall material which physically separates the core from the imaging layer.

In one embodiment, the plate is exposed through the microcapsules and developed by the dampening rollers of the press. Upon pressure contact with the rollers, the capsules are ruptured and the developers (the core material) are released into the imaging layer. For negative-working plates, the developer diffuses into the photosensitive imaging layer, swells or dissolves the non-crosslinked areas of layer, and facilitates a fast development of image by the fountain solution and the ink of the press.

The utilization of microcapsules for the functions and purposes herein described is an unprecedented departure from the teachings of conventional practices. Under conventional printing processes, the developers are usually low molecular weight organic compounds such as benzyl alcohol, ethylene glycol monomers, or γ-butyrolactone, and are quite often soluble in water. Such favored ingredients possess several properties which practically preclude their use for microencapsulations: (1) they have low boiling points or vapor pressures, which would allow them to escape the microcapsules by evaporation; and (2) their level of toxicity is environmentally undesirable. Water immiscible developers are preferred herein in part because they may be microencapsulated by inexpensive processes in the aqueous phase.

In departure from conventional plate development practices, it has now been found that high-boiling point, water insoluble organic solvents for lithographic coatings may serve as developers and encapsulant (core material) for on-press development by microcapsules: (1) Use of these compositions provides on-press developability, (2) The components have low water solubility and low volatility, which makes them desirable for the encapsulation process, and (3) The components have low toxicity and are not strong irritants.

In light of the above, it is an object of the present invention to provide a lithographic printing plate comprising a substrate having either a negative affinity or positive affinity to printing ink; a polymeric photoresist deposited over said substrate having an affinity to said ink substantially converse to the affinity of the substrate to said printing ink; the polymeric photoresist capable of imagewise photodegradation or photohardening upon imagewise exposure to actinic radiation; and a plurality of microcapsules, each microcapsule comprising an external shell phase and an internal encapsulant phase, the internal encapsulant phase comprising a developer component capable of promoting the imagewise removal of either exposed or unexposed areas of the polymeric photoresist when the internal encapsulant phase is blanketwise released by the blanketwise rupturing of the microcapsules.

It is another object of the present invention to provide a developer sheet useful for promoting the development of a lithographic printing plate when the developer sheet is brought into crushing contact with a lithographic printing plate and wherein the lithographic printing plate comprises a polymeric photoresist layer deposited over a substrate, said developer sheet comprising a sheet support; and a microcapsule layer deposited on the sheet support comprising a plurality of microcapsules, each microcapsule comprising an external shell phase and an internal encapsulant phase, the internal encapsulant phase comprising a developer component capable of promoting the imagewise removal of either exposed or unexposed areas of the polymeric resist layer when the internal encapsulant phase is released by the blanketwise rupturing of the microcapsules.

It is another object of the present invention to provide a method of lithographically printing images on a receiving medium comprising the steps of providing on a substrate a polymeric photoresist capable of being imagewise photodegraded or photohardened upon imagewise exposure to actinic radiation, and a plurality of microcapsules, each microcapsule comprising an external shell phase and an internal encapsulant phase, the internal encapsulant phase comprising a developer component capable of promoting the imagewise removal by fountain and ink solutions of either exposed or unexposed areas of the polymeric photoresist; imagewise exposing the polymeric photoresist to actinic radiation for a sufficient duration and at a sufficient intensity to imagewise photodegrade or photoharden the exposed areas; and blanketwise rupturing the microcapsules to blanketwise release the internal encapsulant phase of each microcapsule thereby rendering either exposed or unexposed areas of the polymeric photoresist susceptible to removal by fountain and ink solutions; and treating the polymeric photoresist with press fountain and ink solutions in a printing press to remove either exposed or unexposed areas of the polymeric photoresist and correspondingly bare the underlying substrate, whereby ink becomes imagewise localized in either unremoved polymeric photoresist or bared substrate to form an image transferable to receiving media, such as paper.

It is another object of the present invention to provide a method of lithographically printing images on a receiving medium utilizing a lithographic printing plate, the printing plate having provided thereon a polymeric photoresist capable of being imagewise degraded or hardened upon imagewise exposure to actinic radiation, said method comprising the steps of imagewise exposing the polymeric photoresist to actinic radiation for a sufficient duration and at a sufficient intensity to imagewise degrade or harden the exposed areas; bringing a developer sheet into substantially face-to-face contact with the polymeric photoresist layer; blanketwise rupturing the microcapsules of the developer sheet to blanketwise release the internal encapsulant phase thereby rendering either exposed or unexposed areas of the polymeric photoresist susceptible to removal by press fountain and ink solutions; and treating the polymeric photoresist with press fountain and ink solutions in a printing press to remove either exposed or unexposed areas of the polymeric photoresist and correspondingly bare the underlying substrate, whereby ink becomes imagewise localized in either unremoved polymeric photoresist or bared substrate to form an image transferable to receiving media, such as paper.

For a further description of the nature and objects of the invention, reference should be had to the following detailed description and the accompanying drawings.

DETAILED DESCRIPTION OF THE INVENTION

The present invention provides several product and method embodiments designed to advance on-press developability of lithographic printing plates, representative examples of which are illustrated in the several drawings.

Figure 1:
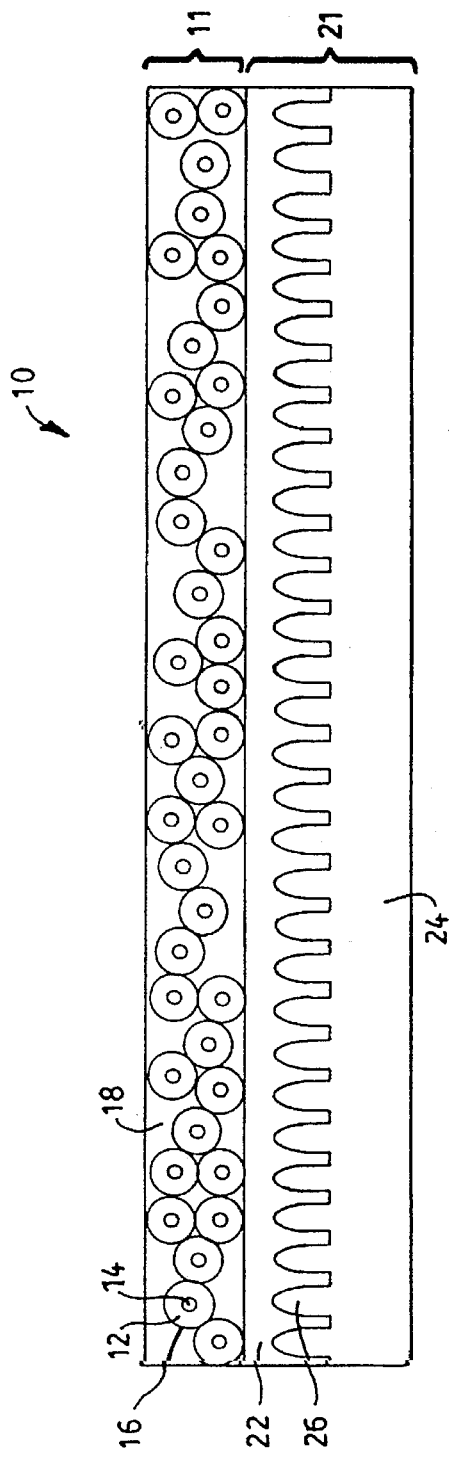
FIG. 1 of the accompanying drawings is a schematic cross-sectional representation of an embodiment of a lithographic printing plate according to the present invention.

One product embodiment, a dual-layer lithographic printing plate 10, is schematically illustrated in FIG. 1. As drawn (not to scale), dual-layer printing plate 10 comprises a plate layer 21 and a microcapsule layer 11. Plate layer 21 is comprised of a suitable printing plate substrate 24 and a polymeric photoresist layer 22. Microcapsule layer 11, layered atop plate layer 21, is comprised of a plurality of microcapsules 16 contained in a binder matrix 18. Each of the microcapsules 16 comprises an outer shell phase ("shell") 12 and an internal encapsulant phase ("core") 14. As illustrated in exaggerated fashion in FIG. 1, an upper surface of substrate 24 may be provided with a plurality of grains ("graining") 26 obtained by several processes discussed in further detail below. As will be noted, and which will also be discussed in further detail below, polymeric photoresist layer 22 is preferably coated onto substrate 24 above the microstructure of the grains 26, the microstructure being shown in FIG. 1 in exaggerated fashion. It is noted that in some cases, a water-soluble release layer (not shown) between the substrate 24 and the resist layer 22 or a separate water-soluble polymeric overcoat (not shown) on the top of the microcapsule layer 11 may also be employed to enhance the performance of the lithographic plate.

Another product embodiment, a pseudo- mono-layer lithographic printing plate 30, is prepared by a single-pass coating process from a coating composition comprising dispersed microcapsules, a photosensitive resist composition, and solvents. Since the coating process involves only a "single-pass", it is believed that pseudo-mono-layer-embodiment is more easily manufactured at a lesser cost.

Figure 2:
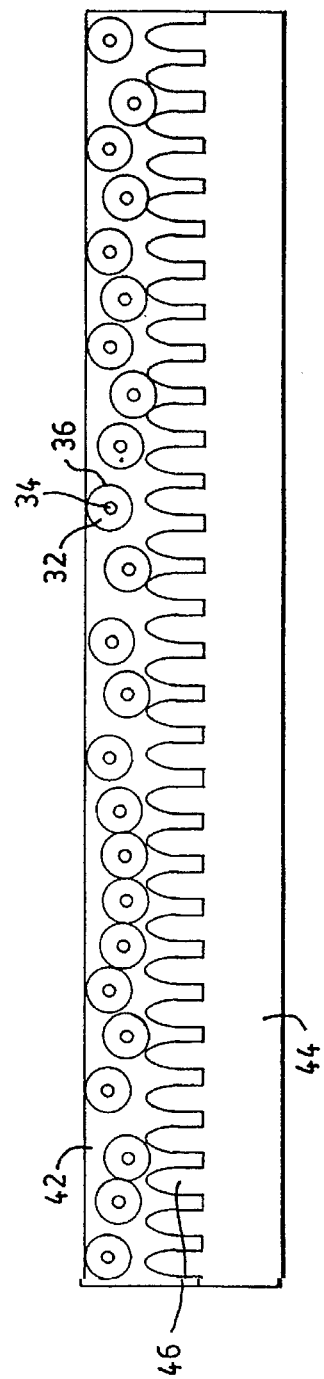
FIG. 2 is a schematic cross-sectional representation of another embodiment of a lithographic printing plate according to the present invention.

Pseudo-mono-layer lithographic printing plate 30 is schematically illustrated in FIG. 2. As drawn (not to scale), pseudo-mono-layer printing plate 30 is comprised of a substrate 44 and a polymeric resist layer 42 having a plurality of microcapsules 36 interspersed therethrough. Further, as with the dual-layer printing plate 10, the microcapsules 36 of the mono-layer printing plate 30 are comprised of an outer shell phase ("shell") 32 and an internal encapsulant phase ("core") 34.

Figure 6:
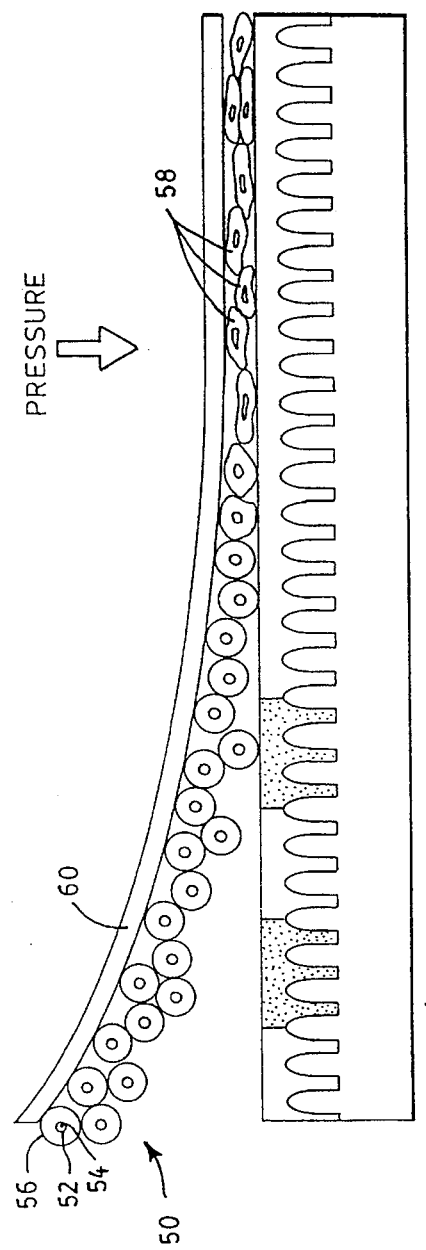
FIG. 6 is a schematic cross-sectional representation of another embodiment of the present invention in use to facilitate development of the photoexposed conventional plate illustrated in FIG. 5.

Another product embodiment, a developer sheet 50, is schematically illustrated in FIG. 6. As shown (not to scale), developer sheet 50 is comprised of a sheet support 60 (i.e. a base) onto which are bound a plurality of microcapsules 56. As with both of the preceding product embodiments, the microcapsules 56 of developer sheet 50 also comprise an outer shell phase (i.e. "shell") 52 and an inner core phase ("core") 54.

With regard to substrates 24 and 44 of dual-layer printing plate 10 and mono-layer printing plate 20, respectively, certain factors are considered in determining appropriate materials. Such factors vary with the particular lithographic needs of individual projects and are believed to be within the grasp of one having skill in the pertinent art. Regardless, for most lithographic need envisioned, suitable substrates will generally include those to which layer polymeric resist layers 22 and 42 can be adhered adequately, prior to photoexposure, and to which photoexposed printing (image) areas are adhered after photoexposure. Other pertinent considerations may be extrapolated on the basis of the present disclosure.

In practice, substrate materials for use in the manufacture of printing plates will oftentimes be subjected to one or more treatments in order to improve adhesion of a photosensitive coating, or to increase the hydrophilic properties of the substrate material, and/or to improve the developability of the photosensitive coating, as is described in the aforementioned U.S. Pat. No. 4,492,616. Thus, substrates 24 and 44 will typically be treated (for example, by polyvinylphosphonic acid, silicate or by anodization, or by corona discharge or plasma treatment, or by roughening or graining treatment) to promote desired adhesion of polymeric resist layers 22 and 42.

Especially preferred substrates are the metallic substrates of aluminum, zinc, steel or copper. These include the known bi-metal and tri-metal plates such as aluminum plates having a copper or chromium layer; copper plates having a chromium layer; steel plates having copper or chromium layers; and aluminum alloy plates having a cladding of pure aluminum. Other preferred substrates are silicon rubbers and metallized plastic sheets such as poly(ethylene terephthalate).

Preferred plates are the grained aluminum plates, where the surface of the plate is roughened mechanically or chemically (e.g., electrochemically) or by a combination of roughening treatments. Anodized plates can be used to provide an oxide surface. Anodization can be performed in an aqueous alkaline electrolytic solution, including, for example, alkali metal hydroxides, phosphates, aluminates, carbonates and silicates, as is known in the art. An aluminum plate, grained and/or anodized, which, for example, has been treated with polyvinylphosphonic acid or otherwise provided with a resinous or polymeric hydrophilic layer, can be suitably employed as a substrate.

Examples of printing plate substrate materials which can be used in the production of printing plates of the invention, and methods of graining and hydrophilizing such substrates are described, for example, in U.S. Pat. No. 4,153,461 (issued May 8, 1979 to G. Berghäuser, et al.); U.S. Pat. No. 4,492,616 (issued Jan. 8, 1985 to E. Pliefke, et al.); U.S. Pat. No. 4,618,405 (issued Oct., 21, 1986 to D. Mohr, et al.); U.S. Pat. No. 4,619,742 (issued Oct. 28, 1986 to E. Pliefke); and U.S. Pat. No. 4,661,219 (issued Apr. 28, 1987 to E. Pliefke).

Figure 5:
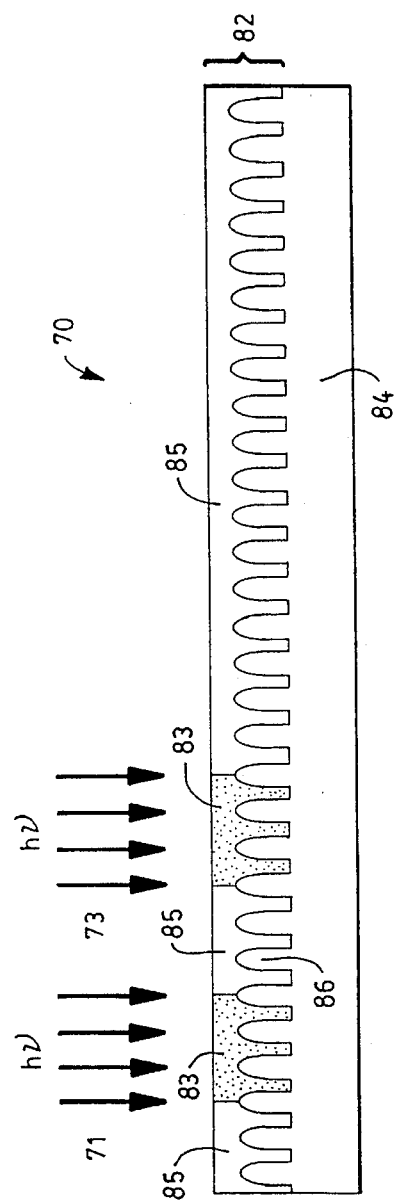
FIG. 5 is a schematic cross-sectional representation of a conventional plate during photoexposure.

In a conventional plate, such as plate 70 shown in FIG. 5, exposure to actinic radiation is made directly onto resist layer 82 to imagewise differentiate exposed areas 83 and unexposed areas 85. Depending on whether resist layer 82 is positive-working or negative-working, areas 83 or 85 are either photohardened or photosolubilized. Regardless, development of plate 70 is typically accomplished by washing the plate with specific developers, organic solvents, surfactant solutions or sometimes with water or with fountain solution which is used in the printing arts. Washing can be effected by dipping, spraying or coating the plate with the washing fluid and by rinsing and drying the plate. Mechanical rubbing or brushing can be employed to assist development.

Since photoexposed printing plates of the invention can be developed in absence of prior treatment with developing solution typically employed in a lithographic printing operation, it will be advantageous in most instances to eliminate post-exposure operations where possible or practical, and to place the photoexposed printing plate directly Onto a printing press for "on-press" development. This affords notable advantages, including the elimination of post-exposure operations and the time saving associated with the elimination of conventional washing, gumming and other post-exposure operations.

Figure 3:
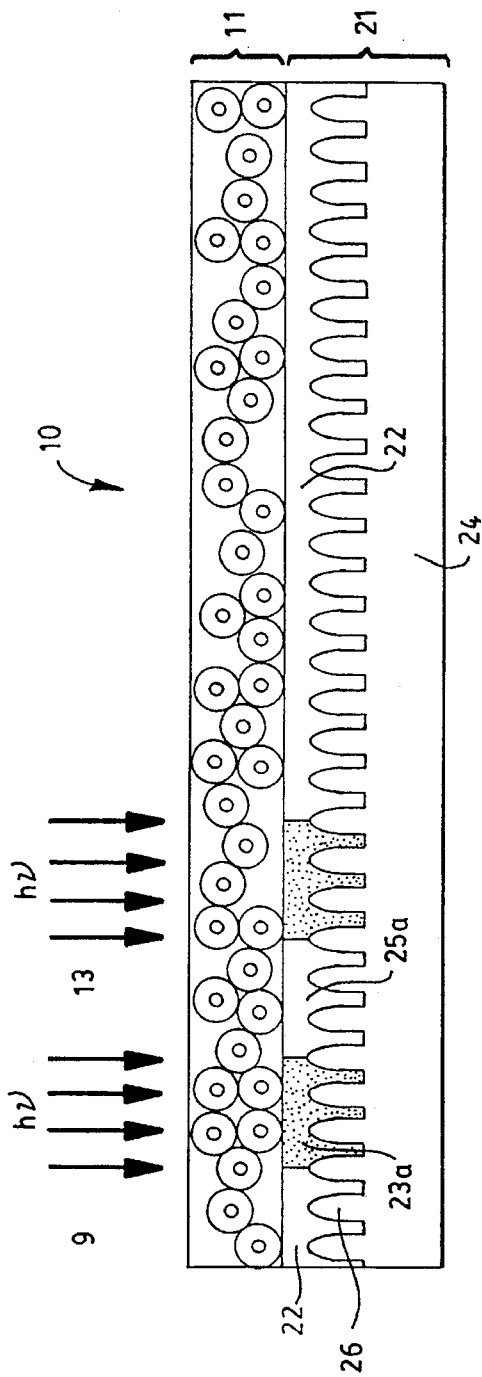
FIG. 3 is a schematic cross-sectional representation of the lithographic printing plate embodiment illustrated in FIG. 1 during exposure to actinic radiation.
Figure 4:
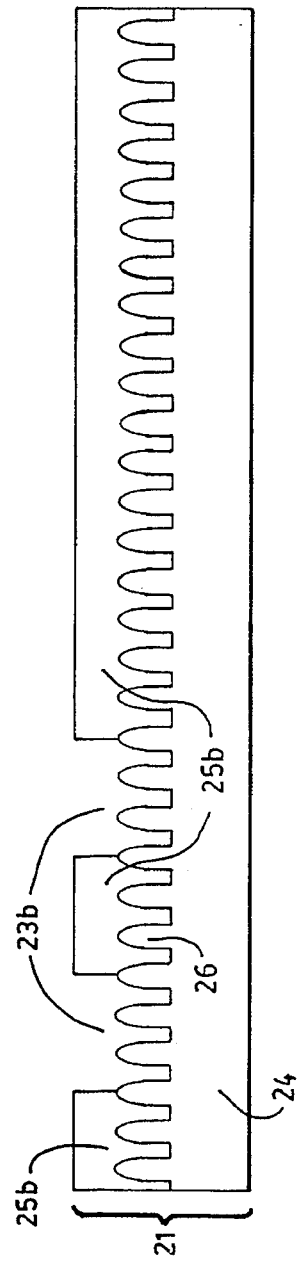
FIG. 4 is a schematic cross-sectional representation of a lithographic printing plate after on-press development according to the present invention.

One such plate that meets these "on press" criteria, is a dual-layer printing plate 10 illustrated in FIG. 1. In FIG. 3, the imagewise exposure of dual-layer printing plate 10 to actinic radiation through microcapsule layer 11 is shown. Areas of exposure are shown by reference to the arrow groupings 9 and 13. Imagewise photoexposure of dual-layer printing plate 10 to actinic radiation imagewise effects photodegradation (e.g. photosolubilization) or photohardening (e.g., photopolymerization) of polymeric resist layer 22 in exposed regions 23a to provide oleophilic (i.e., positive affinity to ink) printing areas. The photoexposed plate shown in FIG. 3 can then be mounted directly onto a printing press where exposed regions 23a (i.e., in positive-working resists) or unexposed regions 25a (i.e., in negative-working resists) are imagewise removed by the action of developer blanketwise released from the microcapsules ruptured by press rollers, and by the contact of the plate by lithographic fountain solution and ink, thus baring the underlying substrate 24. A resulting positive-working printing plate is shown in FIG. 4, wherein areas 23b result from the removal of photosolubilized areas 23a and image areas 25b of photoresist 22 remain on the hydrophilic surface on plate 24. Optionally, the microcapsules on the exposed plate may be blanketwise ruptured by a separate pressure roller before the plates are mounted on the press.

Polymeric resist layer 22 provides several functions in the printing plates of the pertinent embodiments of the invention. Principally, however, polymeric resist layer 22 comprises the principal imaging layer of dual-layer printing plate 10 and comprises a polymeric binder and a photoactive compound which promotes degradation or hardening of the layer in photoexposed areas.

Photosolubilization or photohardening of polymeric resist layer 22 during exposure of dual-layer plate 10 can be effected by including therein any variety of compounds, mixtures, or mixtures of reaction compounds or materials capable of being physically altered by photoexposure or of promoting physical alteration (solubilization or hardening) of the properties of the layer in areas of photoexposure. Compounds and materials suitable for this purpose include monomeric photopolymerizable compounds which undergo free-radical or cation-initiated addition polymerization. Also suitable are macromolecular or polymeric compounds having pendant groups, such as ethylenically unsaturated groups which promote crosslinking or hardening upon photoexposure or other reactive, e.g., cinnamate, groups which promote hardening by crosslinking or photodimerization.

If desired, an unreacted mixture of copolyester precursor reactants, and an acidic photodegeneratable catalyst, can be employed as a photoreactive system for the production of a copolyester. For example, a mixture of dicarboxylic and diol precursor compounds to a condensation polymer can be esterified in areas of photoexposure using acidic photogenerated catalyst, for the production in exposed areas of a condensation polymer with accompanying a desired photohardening. Reactive monomers suited to the production of oligo esters, such as are described in U.S. Pat. No. 3,968,085 (issued Jul. 6, 1976 to G. Rabilloud, et al.), can be employed.

Especially preferred for promoting photohardening of polymeric resist layer 22 is a polymerizable monomer which forms a macromolecular or polymeric material upon photoexposure, preferably a photopolymerizable ethylenically unsaturated monomer having at least one terminal ethylenic group capable of forming a high polymer by free-radical initiated, chain-propagated addition polymerization. Polymerization can be effected by using a photoinitiator, i.e. a free-radical generating, addition polymerization-initiating system activatable by actinic radiation. Such addition polymerization-initiating systems are known and examples thereof are described hereinafter.

Preferred polymerizable monomers are the polyfunctional acrylate monomers such as the acrylate and methacrylate esters of ethylene glycol, trimethylolpropane and pentaerythritol. These can be polymerized in exposed regions of polymeric resist layer 22 in the presence of a photoinitiator. Suitable photoinitiators include the derivatives of acetophenone (such as 2,2-dimethoxy-2-phenylacetophenone), benzophenone, benzil, ketocoumarin (such as 3-benzoyl-7-methoxy coumarin), xanthone, thioxanthone, benzoin or an alkyl-substituted anthraquinone, diaryl iodonium salt, triaryl sulfonium salts, azobisisobutyronitrile and azo-bis-4-cyanopentoic acid, although others can be employed.

A photosensitive composition which comprises a water-soluble macromolecular binder, the polymerizable monomers and a photoinitiator, can be suitably coated into a layer which, upon photoexposure, undergoes insolubilization and hardening as the result of polymerization of the polymerizable monomer and grafting of the monomer onto the polymeric binder. If desired, other crosslinking agents can be included to promote crosslinking via the unsaturated moieties thereof to the polymerizable monomers or the binders.

Also suitable photosensitive components are preformed polymers which contain pendant reactive groups which are altered by photoexposure or which promote a change in the physical properties of layer 22 upon photoexposure. Such reactive groups include those which undergo rearrangement, cycloaddition, insertion, coupling, polymerization or other reactions. Preferred polymers are those having pendant ethylenically unsaturated moieties which can be crosslinked by irradiation, using a photoinitiator or a photosensitizer. Preformed polymers having pendant crosslinkable groups include, for example, the reaction product of a hydroxyl-containing polymer (e.g., a polyester of a dicarboxylic acid and a polyhydric alcohol) and a vinyl monomer containing isocyanate groups (e.g., isocyanatoethyl acrylate or methacrylate). Cross-linking agents and photoinitiators can be used to provide a cross-linked polymer having urethane linkages and hardening of polymeric resist layer 22.

If desired, preformed polymers having pendant reactive groups such as cinnamate groups can be used to promote photoinsolubilization or photohardening. For example, polyvinyl cinnamate formed by the esterification of hydroxyl groups of polyvinyl alcohol using cinnamic acid or cinnamoyl chloride, can be used to promote crosslinking by photodimerization of cinnamoyl groups.

Preformed polymers having pendant pyridium ylide groups, which groups, upon photoexposure, undergo ring expansion (photorearrangement) to a diazepine group with accompanying insolubilization can also be employed. Examples of polymers having such groups are set forth in U.S. Pat. No. 4,670,528 (issued Jun. 2, 1987 to L. D. Taylor, et al.).

The principal component of polymeric resist layer 22 for most plates is a polymeric binder which provides a hydrophobic layer of suitable oleophilicity and ink receptivity. Among preferred compositions of polymeric resist layer 22 are composition containing: a macromolecular organic binder; a photopolymerizable ethylenically unsaturated monomer having at least one terminal ethylenic group capable of forming a high polymer by free-radical initiated, chain-propagated addition polymerization; and a free-radical generating, addition polymerization-initiating system activatable by actinic radiation. Suitable macromolecular binder materials include: vinylidene chloride copolymers (e.g., vinylidene chloride/acrylonitrile copolymers, vinylidene chloride/methylmethacrylate copolymers and vinylidene chloride/vinyl acetate copolymers); ethylene/vinyl acetate copolymers; cellulose esters and ethers (e.g., cellulose acetate butyrate, cellulose acetate propionate, and methyl, ethyl benzyl cellulose); synthetic rubbers (e.g., butadiene/acrylonitrile copolymers; chlorinated isoprene and 2-chloro-1,3-butadiene polymers); polyvinylesters (e.g. vinyl acetate/acrylate copolymers, poly(vinyl acetate) and vinyl acetate/methylmethacrylate copolymers); acrylate and methacrylate copolymers (e.g., polymethylmethacrylate); vinyl chloride copolymers (e.g., vinyl chloride/vinylacetate copolymers); and diazo resins such as the formaldehyde polymers and copolymers of p-diazo-diphenylamine.

Suitable photopolymerizable ethylenically unsaturated monomers for such composition include the difunctional, trifunctional and polyfunctional acrylates, such as the aforementioned acrylate and methacrylate esters of polyhydric alcohols (e.g., pentaerythritol triacrylate and trimethylolpropane triacrylate). Other suitable monomers include ethylene glycol diacrylate or dimethacrylate or mixtures thereof; glycerol diacrylate or triacrylate; and the ethoxylates thereof. Also useful are oligomeric polyester diol diacrylate, polyether diol diacrylate, and other acrylated oligomeric polyols. Polyfunctional vinyl ethers and epoxy monomers or oligomers are also very useful when cationic photoinitiators such as diaryl iodonium and triaryl sulfonium salts are employed.

Known macromolecular binder and polymerizable monomer combination for the production of photoresists which provide lithographic printing surfaces can be suitably employed herein for the production of polymeric resist layer 22. Upon photoexposure of a negative-working resist, exposed regions 23a of polymeric resist layer 22 are hardened by the effects of homopolymerization of the polymerizable monomer and by graft polymerization, if any, involving the macromolecular binder.

It will be appreciated that for positive-working plates, exposed regions 23a of polymeric resist layer will be degraded as a result of the decomposition of its constituents by the exposure to actinic radiation. For example, positive working plates utilizing an orthoquinonediazide compound and a phenol resin have been widely used. In such plates the orthoquinonediazide compound decomposes upon exposure to actinic radiation to form a five-membered carbocyclic acid which is alkali soluble. As an alternative to orthoquinonediazide-based positive resist layers, other positive working resist layers utilize polymer compounds having an orthonitrocarbinol ester group, such as disclosed in Japanese Published Examined Patent Application No. 2696/1981.

Still other positive working resist layers apply a process by which exposure areas are solubilized by causing a secondary reaction with an acid formed by photolysis. Examples of compounds which may be photolysed to form acids include acetal or O,N-acetal compounds (Japanese Published Unexamined Patent Application No. 89003/1973), an orthoester or amidoacetal compound (Japanese Published Unexamined Patent Application No. 120714/1976), a polymer having an acetal or ketal group in the principal chain (Japanese Published Unexamined Patent Application No. 133429/1978), an enolether compound (Japanese Published Unexamined Patent Application No. 12995/1980), an N-acyliminocarbonic acid compound (Japanese Published Unexamined Patent Application No. 126236/1980), and a polymer having an orthoester group in the principal chain (Japanese Published Unexamined Patent Application No. 17345/1981).

Photoexposure of the printing plates can be accomplished according to the requirements dictated by the particular composition of layer polymeric resist layer 22 and the thickness thereof. In general, actinic irradiation from conventional sources can be rased for photoexposure, for example, relatively long wavelength ultraviolet irradiation or visible irradiation. UV sources will be especially preferred and include carbon arc lamps, "D" bulbs, Xenon lamps and high pressure mercury lamps.

The thickness of the photoresist layer 22 can vary with the particular requirements. In general, it should be of sufficient thickness to provide a durable photohardened printing surface. Thickness should be controlled, however, such that it can be exposed within exposure-time requirements and should not be applied at a thickness that hampers ready removal of the layer in non-exposed areas by developers. Good results are obtained by using a polymeric resist layer having a thickness in the range of from about 0.2 microns to about 3 microns above the grain (preferably 0.2 to 0.6 microns above the grain) as schematically illustrated in FIG. 1.

Polymerie resist layer 22 can be provided with colorants, e.g., tint dyes, to provide a desired and predetermined visual appearance. Especially preferred will be a colorant, or a precursor of a species, respectively, capable either of being rendered colorless, or being provided with coloration by the irradiation of the plate-making photoexposure step. Such dye or dye-precursor compounds and the light absorption differences promoted by the photoexposure allow the platemaker to distinguish readily the exposed from the non-exposed regions of the plate in advance of placing the photoexposed plate onto a printing press for the conduct of a printing run.

In addition, the operability of the photoresist layer may be improved by the addition of certain additives. For example, polymeric resist layer 22 can contain plasticizers, photosensitizer .or catalysts appropriate to the particular photoactive compound or system employed, hardeners, or other agents to improve coatability. Polymeric resist layer may also contain antioxidant materials to prevent undesired (premature) polymerization and examples include derivatives of hydroquinone; methoxy hydroquinone; 2,6-di-(t-butyl)-4-methylphenol; 2,2'-methylene-bis-(4-methyl-6-t-butylphenol); tetrakis {methylene-3-(3',5'-di-t-butyl-4'-hydroxyphenyl)propionate}methane; diesters of thiodipropionic acid, triarylphosphite. It is noted however that the use of such additives is not necessary for the operability of the present invention. However, incorporation of such additives may dramatically enhance performance. It is also noted that such plasticizers, contrast dyes, imaging dyes and other additives may also be included in the microcapsules. Inclusion in the microcapsules provides a wider latitude in the selection of such additives, since neither the solubility of the additives in the photopolymerizable compositions nor the inhibition or retardation effect of some additives on polymerization would be an issue in such a system. Further, preferred embodiments will incorporate or otherwise utilize the subject matter encompassed by the applications cross-referenced above. For example, good results have been achieved by using an encapsulated developer system of the present invention with a photoresist having the plasticizer system described in U.S. patent application Ser. No. 08/147,044, the dispersed particulate rubber systems described in U.S. patent application Ser. No. 08/146,479, and utilizing the photoreactive polymeric binders described in U.S. patent applications Ser. Nos. 08/147,045 and 08/146,711.

It will be appreciated that the components of the photoresist should be selected in consideration of compatibility with press ink solution and the desirability of maintaining the fountain/ink balance of the fluid press environment. When plates according to the present invention are developed on-press, advantage is achieved by the uptake of "removed" photoresist areas (removed by development) by press ink away from the fluid press environment and their subsequent deposition onto the initial units of receiving media.

The microcapsules utilized in the present invention comprise at least a core material that is a good developer for the image layer and an impermeable wall material which physically separates the core from the imaging coat. The plate would be extremely tacky if such a high level of developer were not physically separated from the image layer.

The microcapsules can be prepared by conventional coacervation processes, such as those set forth in U.S. Pat. Nos. 2,800,475, 2,800,458, 3,041,289, and 3,687,865. Also useful are interfacial polymerization processes, such. as those set forth in U.S. Pat. Nos. 3,287,154, 3,492,380 and 3,557,515, U.K. Pat. Nos. 990,443, 1,046,409 and 1,091,141, Japanese Patent Publications Nos. 38(1963)-19574, 42(1967)-446, 42(1967)-771; in situ polymerization processes, such as those set forth in U.S. Pat. No. 4,001,140, U.K. Pats. Nos. 867,797 and 989,264; Japanese Patent Publication Nos. 12,380/62, 14,327/62, 29,483/70, 7,313/71 and 30,282/71; a process utilizing isocyanate-polyol wall material as that set forth in U.S. Pat. No. 3,795,669; a process of using isocyanate wall materials as described in U.S. Pat. No. 3,914,511; a process of using urea-formaldehyde-resorcinol wall forming material as described in U.S. Pat. Nos. 4,001,140, 4,087,376 and 4,089,802; a process of using melamine-formaldehyde resins, hydroxypropyl cellulose or like as a wall forming material as described in U.S. Pat. No. 4,025,455; an electrolytic dispersion and cooling process as described in U.K. Pat. Nos. 952,807 and 965,074; and a spray-drying process as described in U.S. Pat. No. 3,111,407 and U.K. Pat. No. 930,422. Preferred microcapsules are those having a multi-layer wall around the core encapsulant. These can be made, for example, by forming a first, thin wall by an interfacial polymerization reaction, and subsequently forming a second, thicker wall by an in-situ polymerization reaction or by a coacervation process.

The first wall of the microcapsule will be typically comprised of polyurea, polyurethane, polyamide, polyester, epoxy-amine condensates and silicones. The second wall of the microcapsule is typically comprised of condensates of melamine-formaldehyde, urea-formaldehyde, resorcinol-formaldehyde, phenol-formaldehyde, gelatin-formaldehyde, or interpolymer complexes of two oppositely charged polymers such as gelatine/gum arabic and poly(styrene sulfonic acid)/gelatine.

Among the encapsulated developers that may be utilized in the microcapsules are γ-phenyllactone, γ-butyrolactone, ε-capralactone, δ-valerolactone, γ-hexalactone, δ-nonalactone, α-angelica lactone, 2-[2-(benzyloxy)ethyl]-5,5-dimethyl-1,3-dioxane, dimethylphthalate, dibutyl phthalate and other dialkyl phthalate, tricrecyl phosphate, esters of trimethylolpropane, 4-(p-acetoxyphenyl)-butan-2-one, triacetin, diesters of triethylene glycol or teraethylene glycol, derivatives of pyrollidone, N,N-dialkylacetamide, morpholine, trialkyl-1,1,2-ethane tricarboxylate, 4,4'-trimethylenebis (1-methylpiperidine), 4,4'-trimethylene bis(1-piperidineethanol), N,N-dimethylaniline, 2,6-dialkyl-N,N-dimethylaniline, alkylbenzenesuflonamin, 3-phenoxy-1,2-propanediol, phenethyl isobutyrate, triesters of glycerin, dialkyl adipate, alkoxybiphenyl.

Preferred encapsulants are high-boiling point, low vapor pressure, water insoluble solvents and cosolvents such as dimethylphthalate, dibutylphthlate, dioctylphthalate, tricrecylphosphate 4-(p-acetoxyphenyl)-butan-2-one, δ-nonalactone, triesters of glycerin, trimethylol-propane or pentaerithriol, N,N-dialkylaniline derivatives, γ-phenylactone, toluenesulfonamide derivatives, alkoxybiphenyl, and dialkyl adipate.

In preparing the microcapsules with high-boiling, water insoluble developers, it has been found that the developers may be encapsulated in the presence of the following: (1) an encapsulatable organic base, preferably a tertiary amine such as derivatives of N,N-dimethylaniline, piperidine, morpholine, and ethylene diamine; (2) an oil soluble surfactant or co-surfactant with an HLB of lower than 10, preferably between 3–8. The resulting capsules may be dispersed in the coating solutions comprising of (1) a hydrophilic binder or combination of binders which are compatible with the inks and fountain solutions commonly used in the press operations, (2) a water soluble surfactant to facilitate wetting and leveling of the coating, (3) high boiling, water soluble codevelopers to promote the dissolution of the binders in the fountain solution and the development efficiency of the developers released from the capsules. Examples of suitable water soluble binders include, but are not limited to, gum arabic, cellulose ethers, dextran sulfate, pectins, polyvinyl alcohol, polyvinyl pyrrolidone, polyvinylphosphonic acid, polystyrene sulfonic acid, polyacrylic acid and their copolymers. Examples of water soluble co-developers in the coating formulation include, but are not limited to, urea, sugar, tetraethyleneglycol diacetate, triethylene diacetate, N,N,N', N'-tetrakis(2-hydroxyalkyl)ethylene diamine, trihydroxyhethane, triethanolamine, citric acid, N-alkylpyrrolidone, lithium salts, sodium bicarbonate and sodium bisulfate. Examples of surfactants include, but are not limited to, alkylphenol-ethylene oxide adducts such as Triton X-100, block copolymers of ethylene oxide and propylene oxide such as Pluronic L44, L64 and P65, dialkylester of sodium sulfosuccinic acid such as Aerosol TO, and silicone block copolymers such as Silwet surfactants.

Suitable methods for coating the microcapsule coating solution onto the substrate include an air knife coating method, a blade coating method, a brush coating method, a curtain coating method or a slot-and-slit coating method. These methods can be selected by one skilled in the art in view of the present disclosure.

The particle size of the microcapsule should be well-controlled in a narrow range with the mean particle size falling between 1–20 microns, preferably between 6–14 microns. Too big a capsule will result in poor processability. In this regard, it is noted that a capsule larger than 14 microns can be ruptured easily by hand. On the other hand, too small a capsule may result in a poor release of developers on the press. The compressive force at the tip of the blanket in a printing press is generally in the range of 80–250 pli which is enough to rupture most of the capsules on a highly textured plate.

For embodiments of the present invention utilizing an overlying microcapsule layer, said layer should be prepared so as to reduce scattering of the actinic radiation and thereby allow transmission of the actinic radiation to the underlying photosensitive layer. This is typically achieved by filling the microvoids or interstices among the microcapsules with water soluble binders, additives, or water re-dispersible latices which have about the same refractive indices as the microcapsules. Alternatively, the degree of light scattering by the microcapsule layer may also be reduced by applying a small amount of water or fountain solution onto the capsule layer immediately before the exposure step.

In contrast to the representative embodiments illustrated in FIG. 1 and FIG. 2 and described above, other embodiments provide microencapsulated developers on a sheet separate from the lithographic printing plate to be developed. As shown in FIGURE. 6, microcapsules 56 are incorporated into a sheet support 60 to form separate developer sheet 50. Developer sheet 50 may be used to develop conventional printing plates such as those represented by printing plate 70. In this regard, conventional printing plate 70 is first exposed to actinic radiation as shown in FIG. 5, then brought into intimate, substantially face-to-face contact with developer sheet 50, then run immediately on a printing press, or initially through a separate pressure-roller or laminator, where the microcapsules 56 are submitted to crushing pressure. The encapsulants (i.e. the internal encapsulant phase) contained in the core 54 of the crushed microcapsules 58 are thus released into the polymeric resist layer 82, thereby effecting development of conventional printing plate 70. On-press development occurs when the plate is mounted and run on a printing press, whereby it is treated with fountain and ink solutions which cause the differentiation of hydrophilic non-image areas 85 and oleophilic image areas 63.

Sheet support 60 of developer sheet 50 can be made from the same material as substrates 24 and 44, as well as other materials that are not necessarily hydrophilic or treated to be hydrophilic, such as paper; paper laminated with a plastic film such as polyethylene, polypropylene or polystyrene film; a metal plate such as aluminum (inclusive of alloy thereof), zinc, iron or copper plate; sheet or film of plastics such as cellulose acetate, cellulose propionate, cellulose propionate, cellulose butyrate, polyethylene terephthalate, polyethylene, polystyrene, polypropylene, polycarbonate and polyvinyl acetal; and paper or plastic film laminated with metallic foil or deposited with a metal layer such as those listed above. Regardless, in view of its specific purposes and goals, developer sheet 50 is preferably made of the plastic sheets or the paper/plastic laminates.

With regard to the encapsulants contained within the microcapsules, as well as the shell materials for microcapsule-itself, the materials noted for the above embodiments above may be utilized. However, there is relatively more latitude provided for selecting both the particle size of the microcapsule and of the microcapsule layer thickness for the developer sheet embodiments as compared with the aforedescribed dual-layer and pseudo-mono layer embodiment; the particle size may be larger (10–15 microns) and the coating may be either thicker or comprise a multilayer. The following table specifies preferred encapsulatable developers utihzed in developer sheet embodiments which may be used to on-press develop presently available commercial lithographic plates:

| Plate | Preferred Developers |
|---|---|
| Howson AQ1 | Dibutyl Phthalate/2,6-dialkyl-N,N-dimthylaniline, δ-valerolactone, 4-(3-oxybutyl)phenyl acetate, TEGDA, 3-phenoxy-1,2-propanediol, α-angelica lactone, γ-hexalactone, 4-amino propyl pyrollidone, ε-capralactone, and mixtures thereof |
| Enco N61, N71, N50. | 3-phenoxy-1,2-propanediol, 4-(3-oxybutyl)phenyl acetate, α-angelica lactone, γ-hexalactone, 4-amino-propyl- pyrollidone, δ-valerolactone, and mixtures thereof |
| Dupont Marathon | 5-nonalactone, phenethyl isobutyrate and mixtures of the two. |
| Fuji FNCB | 4-amino-propyl-pyrollidone. |
| Kodak Aqua Image | ε-capralactone, δ-valerolactone, 4-(3-oxybutyl)phenyl acetate, and mixtures thereof |
| 3M Viking S2 | δ-valerolactone, 4-amino-propyl-pyrollidone. |

In sum, the present invention as described above enables development of exposed printing plates without the need for intermediate bath processing merely by mounting the plate on a printing press, or, alternatively, by initially processing the plate through a separate pressure roller. Printing plates of the present invention possess exceptional photospeed and resolution and have sufficient durability to print as many as one hundred thousand good impressions.

The present invention will now be described in further detail by the following non-limiting examples of several of its embodiments. Unless otherwise indicated, all parts, percents, ratios and the like are by weight.

EXAMPLES

Preparation of Photoresist Solution-1 and 2

Photoresist solutions with 7% of solid were made according to the formulations set forth in Table 1, below. The Image-2 solution contained a photoreactive binder with approximately 10% vinyl substitution and an approximately 2% maleic anhydride group. The Tg of the binder was about 80° C. All solutions were spin-coated on aluminum plates at 200 rpm.

TABLE 1

| | Image Layer Composition (w/w %) | | |
|---|---|---|---|
| Component | Image-1 | Image-2 | Image-3 |
| Acryloid Resin A-11 (from Rohm and Haas) | 16.06 | — | 18.00 |
| Acryloid Resin B-72 (from Rohm and Haas) | 30.00 | — | 33.75 |
| Photoreactive Acrylic Binder* | — | 51.75 | — |
| Ebecryl 8301 oligomer (from Radcure) | 20.64 | 17.42 | 16.55 |
| Trimethylopropane triacrylate | 9.19 | 4.68 | 7.36 |
| Polyurethane PU788 (from Morton) | 5.52 | 7.74 | 4.45 |
| Acrylated Nitrile Butadiene (Hycar 1300 × 33 from BF Goodrich) | 4.00 | 4.00 | 4.00 |
| 3-benzoyl-7-methoxy coumarin** | 1.40 | 1.40 | 1.80 |
| 4-benzoyl-4-methyl diphenyl sulfide** | 1.80 | 1.80 | 2.00 |
| 2-phenyl-4,6-bis-(trichloromethyl-5-triazine)** | — | 2.21 | 2.50 |
| Triethylene glycol diacetate | — | 3.50 | 3.50 |
| Leuco Crystal Violet Dye | 2.54 | 2.77 | 3.14 |
| 2,6-di-tert-butyl-4-methyl phenol (BHT)*** | 0.13 | 0.13 | 0.26 |
| Irganox 1035 (from Ciba-Geigy)*** | 0.10 | 0.10 | 0.20 |
| Pluronic L43 Surfactant (from BASF) | — | 2.50 | 2.50 |
| 2,2'-bis(o-chlorophenyl)-4,5,4',5'-tetraphenyl-1,2-biimidazole** | 3.50 | — | — |
| Diphenyl Phosphate | 2.25 | — | — |
| 2,6-diisopropyl-N,N-dimethyl aniline | 2.25 | — | — |
| Lithium Chloride | 0.62 | — | — |

*The photoreactive acrylic binder contains methyl methacrylate, butyl methacrylate, maleic anhydride, and TMI adduct with hydroxybutyl acrylate. See, U.S. Pat. applications Ser. Nos. 08/147,045 and 08/146,711 cross-referenced above.
**Radical initiator.
***Antioxidant.

Preparation of Microcapsule Composition 1
(Capsule 1)

12 g of a high viscosity grade hydroxycellulose (from Aldrich) and 12 g of Versa TL502 (from National Starch) were dissolved in 430 g of water. The pH was adjusted to 9. A mixture with 190 g of dimethyl phthalate, 3 g of polyisocyanate Desmodur DA and 9 g of polyisocyanate Desmodur N100 (from Miles) was dispersed into the aqueous phase at 1500 RPM for 10 minutes. 0.1 g of triethylene tetramine was added and allowed to react for 30 minutes at 65° C. 246 g of a reelamine-formaldehyde prepolymer (CYMEL 385, from American Cyanamid) was added and the pH adjusted to between 5 and 5.5 with 1N sulfuric acid. The reaction was continued at 65° C. for one hour. Sodium bisulfite was added and the pH was brought to 9 and the reaction allowed to continue for 30 minutes, then slowiy cooled to 25° C. The microcapsules were washed extensively with deionized water in a centrifuge unit. A microcapsule solution was made having 10% microcapsules, 2% PVA205 and 0.2% nonionic surfactant, triton X-100.

Preparation of Microcapsule Composition 2
(Capsule 2)

Microcapsule Composition 2 was prepared as Microcapsule Composition 1. However, as set forth in Table 2, the Hydroxyethyl Cellulose and Versa TL502 components utilized in Microcapsule Composition 1 were replaced with a modified hydroxyethyl cellulose HEC-330 (from Aqualon), PVA205 (from Air Products) and Aerosol-OT (from Fisher). In addition, a mixture containing Gamma Hexalactone and dibutylphthalate were used as the developer instead of dimethylphthalate. Before the pH was adjusted to 9 in the final stages of preparation, urea was added to react for 1 hour to quench with all residual formaldehyde or melamine-formaldehyde condensate in the mixture. As set forth in Table 3A, Microcapsule Composition 2 was added with Silica 2040 (Nyacol) into Overcoat Solution A to form Overcoat Solution B.

Preparation of Microcapsule Composition 3
(Capsule 3)

Microcapsule Composition 3 was prepared as Microcapsule Composition 2. However, the PVA205 and Gamma Hexalactone components in Microcapsule Composition 2 were replaced, respectively, with Versa TL502 and δ-nonalactone. In addition, a small amount of dibutyl tin dilaurate was added into the oleophilic phase to enhance the formation of the prewall. To reduce the solubility of δ-nonalactone in the aqueous phase, both the emulsification and the prewall formation steps were kept at room temperature for two hours instead of 30 minutes at 65° C. As set forth in Table 3A, Microcapsule Composition 3 was added with Silica 2040 (Nyacol) into Overcoat Solution A to form Overcoat Solution B.

Preparation of Microcapsule Composition 4
(Capsule 4)

3.0 g of Versa TL 502, 7.0 g of a high viscosity grade pectin (from Sigma), and 10.0 g of NaCl were dissolved thoroughly in 231.0 g of deionized water at room temperature by a high speed mixer at 1500 rpm. 6.0 g of Desmodur N100 was dissolved in 94.0 g of dioctyl phthalate (DOP) immediately before use. The pH of the aqueous phase was adjusted to 6.0, the temperature was increased to 40° C., and the rpm was increased to 3000. The N100/DOP solution was then added into the aqueous phase and allowed to be emulsified for 70 minutes. A melamine-formaldehyde (M/F) pre-condensate was prepared in the other flask by reacting 9.8 g of melamine in 16.3 of a 37% formaldehyde solution in 110 g of deionized water at pH 8.5, 60° C. for 60 minutes. The resultant M/F pre-condensate was then added into, the emulsion. The pH was adjusted to 6.0, the temperature was increased to 70° C., and the reaction was allowed to continue for 60 minutes. 39.0 g of a 50% urea solution in deionized water were then added over 30 minutes to quench the reaction. The resulting microcapsules had a mean particle size of about 13 microns. The recipe for Capsule 4 is set forth in Table 2.

TABLE 2

Microcapsule Composition (dry weight)

| Component | Capsule 1 | Capsule 2 | Capsule 3 | Capsule 4 |
|---|---|---|---|---|
| Versa TL502 (from National Starch) | 12.0 g | — | 3.9 g | 3.0 g |
| Hydroxyethyl Cellulose (from Aldrich) | 4.0 g | — | — | — |
| Desmodur DA (from Miles) | 3.0 g | — | — | — |
| Desmodur N-100 (from Miles) | 9.0 g | 12.7 g | 11.1 g | 6.0 g |
| Pectin (42H0150 from Sigma) | — | — | — | 7.0 g |
| Triethylene Tetramine | 0.1 g | 2.7 g | 1.4 g | — |
| Cymel 385 (from American Cyanamid) | 246.0 g | 45.7 g | 41.1 g | — |
| Sodium Bisulfite | 5.9 g | — | — | — |
| Dibutyl Tin Dilaurate | — | — | 0.12 g | — |
| HEC330 PA (from Hercules) | — | 9.8 g | 8.0 g | — |
| PVA Vinol 205 (from Air Products) | — | 5.4 g | — | — |
| Aerosol-OT (from Fisher) | — | 0.06 g | 0.06 g | — |
| NaCl | — | 9.7 g | 18.3 g | 10.0 |
| Gamma Hexalactone | — | 24.3 g | — | — |
| Gamma Nonalactone | — | — | 21.5 g | — |
| Dimethyl Phthalate | 190.0 g | — | — | — |
| Dibutyl Phthalate | — | 97.1 g | 89.5 | — |
| Dioctyl Phthalate | — | — | — | 94.0 g |
| Urea | — | 3.2 g | 10.0 g | 19.5 g |
| H₂O | 430.0 g | 490.0 g | 425.0 g | 371.0 g |
| Melamine | — | — | — | 9.8 g |

TABLE 2-continued

Microcapsule Composition (dry weight)

| Component | Capsule 1 | Capsule 2 | Capsule 3 | Capsule 4 |
|---|---|---|---|---|
| Formaldehyde | — | — | — | 6.0 g |

TABLE 3A

Overcoat Solution

| Component | Solution A | Solution B |
|---|---|---|
| Microcapsule @ 39.7% | | 9.45 g |
| Silica 2040 @ 40% | | 0.47 g |
| PVA 205 @ 10% | 1.13 g | 1.13 g |
| Pluronic L43 @ 5% | 2.24 g | 2.24 g |
| Tx100 Surfactant @ 10% | 0.19 g | 0.19 g |
| LiCl @ 2% | 0.06 g | 0.06 g |
| H₂O | 21.38 g | 11.47 g |

EXAMPLE 1

In Examples 1–4, below, the photoreactive image solution was coated onto an anodized aluminum substrate at 200 R.P.M. and dried at 70° C. for 3 minutes. Three plates (Plate 1, Plate 2 and Plate 3) were coated with Image-1 layer. For Plates 1 and 2, a Capsule 1 layer was coated on top of the Image-1 layer. Plate 3 was not provided with a capsule layer. All three plates were imagewise exposed through a mask at 60, 80 and 100 light units. The capsules on Plate 2 were blanketwise pre-crushed by a pressure roller or laminator. All three plates were run on a Multi 1250 press without any preceding wet development. Within 100 and 25 impressions, Plates 1 and 2 were respectively developed with high contrast images and a clear background. In contrast, Plate 3 failed to develop at all after more than two hundred impressions.

EXAMPLE 2

Solution B containing Capsule 2 was coated onto a plate with an Image-2 layer. As a control, solution A without any capsules was coated onto another plate with an Image-2 layer. After imagewise exposing both plates to 10 and 20 UV light units, only the plate with the microencapsulated developer could be developed by the press without a wet development. The control plate which did not contain capsules could not be developed at all by the press.

EXAMPLE 3

Image-2 formulation was coated onto the plate surfaces by a continuous roll coating process. A coating Solution B containing the Capsule 3 was coated onto the image layer. After imagewise exposing the plate to 40 UV light unit, the Capsule 3 were blanketwise fractured by a pressure roller. The plate with the Capsule 3 could be developed by the Multi 1250 press without the need for the wet development process. It took about 20 impressions on the press to develop the plate. In contrast, without the Capsule 3 layer, the plate with the identical image layer was not developable by the press.

EXAMPLE 4

This example demonstrated that the developer of a plate could be transferred from a film with a microencapsulated developer. Capsule Solution B in Example 2 was coated on a Mylar polyester base and dried at 70° C. for 3 minutes. The Image-2 layer was coated onto a plate. Through a mask, this plate was exposed to 10, 15 and 20 light units. The surface of the polyester base with capsules was placed against the image layer. After blanketwise fracturing the capsules with a pressure roller, the developer was transferred from the capsules to the image layer and the polyester base removed. Without wet development, this plate was run on a Multi 1250 press. Within 25 impressions, the images were developed on the press. No development was observed for image areas that were not covered by the polyester during the lamination process.

EXAMPLE 5

A press developable printing plate with microencapsulated developers incorporated into the photoreactive resist forming a single-layer coating was prepared as follows:

An photoreactive imaging solution was prepared with the Image-3 composition of Table 1.

Microcapsules containing developers were subsequently prepared with the Capsule 4 composition of Table 2.

As set forth in Table 3B below, four monocoat formulations having 0%, 3%, 10%, and 25% of Capsule 4 (average particle size: 13 microns) were prepared by dispersing the dried capsules into the Image-3 solution in the presence of polymeric dispersants such as PS-3 (from ICI) and P103 (from BASF).

TABLE 3B

| | Monocoat Formulation (dry weight) | | | |
|---|---|---|---|---|
| Component | 2B-1 | 2B-2 | 2B-3 | 2B-4 |
| Image-3 of Table 1 | 100.0 | 100.0 | 100.0 | 100.0 |
| PS3 (from ICI) | 0.5 | 0.5 | 0.5 | 0.63 |
| P103 (from BASF) | 0.5 | 0.5 | 0.5 | 0.63 |
| Capsule 4 | 0.0 | 3.0 | 10.0 | 25.0** |
| Trethanol amine | 2.0 | 2.0 | 2.0 | 2.0 |
| No. of impressions to clear Dmin by a Multi 1250 Press | >200 | 200 | 15 | 3 |

**A small amount of butanediol was added as a cosolvent to prevent flocculation of the capsules in the Image-3 solution.

The polymeric dispersants and triethanol amine were added to the Image-3 solution and mixed at 500 rpm for 5 minutes in a Ross Mixer. The microcapsules were subsequently added and mixed at 1000–1200 rpm for thirty minutes. The formulations were then spin-coated onto aluminum plates at a speed of 200 rpm and dried in a 70° C. oven for three minutes. After an imagewise exposure the finished plates were installed on a Multi 1250 printing press and run. The control (2B-1) did not develop to any perceptible degree on press even after 200 impressions. As shown, in Table 3B, increasing the capsule content from 3% to 10% and to 25% reduces the number of impressions needed for a clean background from 200 (Plate 2B-2) to 15 (Plate 2B-3), and to 3 (Plate 2B-4) impressions.

We claim:

1. A lithographic printing plate precursor comprising
   a substrate having either a negative affinity or positive affinity to printing ink;
   a polymeric photoresist deposited over said substrate having an affinity to said ink substantially converse to the affinity of the substrate to said printing ink; the polymeric photoresist capable of imagewise photodegradation or photohardening upon imagewise exposure to actinic radiation; and
   a plurality of microcapsules, each microcapsule comprising an external shell phase and a non-photopolymerizable internal encapsulant phase, the internal encapsulant phase comprising a developer component capable of promoting the imagewise removal of either exposed or unexposed areas of the polymeric photoresist when the internal encapsulant phase is blanketwise released by the blanketwise rupturing of the microcapsules.

2. The lithographic plate precursor of claim 1, wherein the developer component is a high-boiling point, low vapor pressure, water insoluble solvent.

3. The lithographic printing plate precursor of claim 1, wherein the plurality of microcapsules are contained in a microcapsule layer, the microcapsule layer being deposited on said polymeric photoresist.

4. The lithographic printing plate precursor of claim 3, wherein the microcapsule layer further comprises water-soluble surfactant, a water soluble binder compatible with ink and fountain solutions, and a codeveloper capable of promoting the dissolution of the binders in fountain and inks solutions.

5. The lithographic printing plate precursor of claim 4, wherein the binder has a refractive index matched with the microcapsules such that actinic radiation may be effectively transmitted through the microcapsule layer without substantial scattering.

6. The lithographic printing plate precursor of claim 1, wherein the external shell phase of the microcapsules is comprised of a multiwall.

7. The lithographic printing plate precursor of claim 1, wherein the microcapsules have a mean particle size falling between approximately 1 μm and approximately 20 μm.

8. The lithographic printing plate precursor of claim 1, wherein the microcapsules are interspersed throughout the photoresist.

* * * * *